United States Patent [19]
Beecham et al.

[11] 4,162,416
[45] Jul. 24, 1979

[54] DYNAMIC SENSE-REFRESH DETECTOR AMPLIFIER

[75] Inventors: David Beecham, Coopersburg; Howard C. Kirsch, Emmaus, both of Pa.

[73] Assignee: Bell Telephone Laboratories, Incorporated, Murray Hill, N.J.

[21] Appl. No.: 869,844

[22] Filed: Jan. 16, 1978

[51] Int. Cl.² .................. H03K 5/20; H03K 3/286; H03K 3/353; G11C 7/06
[52] U.S. Cl. .................. 307/362; 307/279; 307/DIG. 3; 365/205; 365/208; 365/222
[58] Field of Search .............. 307/238, 264, 279, 355, 307/362, DIG. 3, DIG. 4; 365/205, 207, 208, 222

[56] References Cited

U.S. PATENT DOCUMENTS

| | | | |
|---|---|---|---|
| 3,760,381 | 9/1973 | Yao | 307/DIG. 3 X |
| 3,806,898 | 4/1974 | Askin | 307/DIG. 3 X |
| 3,882,326 | 5/1975 | Kruggel | 307/DIG. 3 X |
| 3,976,895 | 8/1976 | Koo | 307/DIG. 3 X |
| 4,007,381 | 2/1977 | Mohsen | 307/362 X |
| 4,028,557 | 6/1977 | Wilson | 307/238 X |
| 4,028,558 | 6/1977 | Heller et al. | 307/355 |
| 4,069,474 | 1/1978 | Boettcher et al. | 307/DIG. 3 X |
| 4,075,515 | 2/1978 | Hoffmann | 307/DIG. 3 X |
| 4,122,549 | 10/1978 | Kinoshita | 307/DIG. 3 X |

*Primary Examiner*—Larry N. Anagnos
*Attorney, Agent, or Firm*—Irwin Ostroff

[57] ABSTRACT

A dynamic sense-refresh detector amplifier consists essentially of a cross coupled MOS transistor pair and two sets of load-refresh circuits which each include a capacitor and three MOS transistors. The load-refresh circuits eliminate the negative effect of threshold voltage losses on noise margin by allowing the memory cell from which information is read out and sensed to be refreshed to full 1 and 0 levels. A control terminal of a transistor of each load-refresh circuit is coupled to the transistor of cross coupled pair not associated with that load-refresh circuit. In addition, a voltage clamping transistor is used with each load device to further increase operating noise margins. The dynamic operation of the amplifier allows for relatively low power dissipation.

8 Claims, 2 Drawing Figures

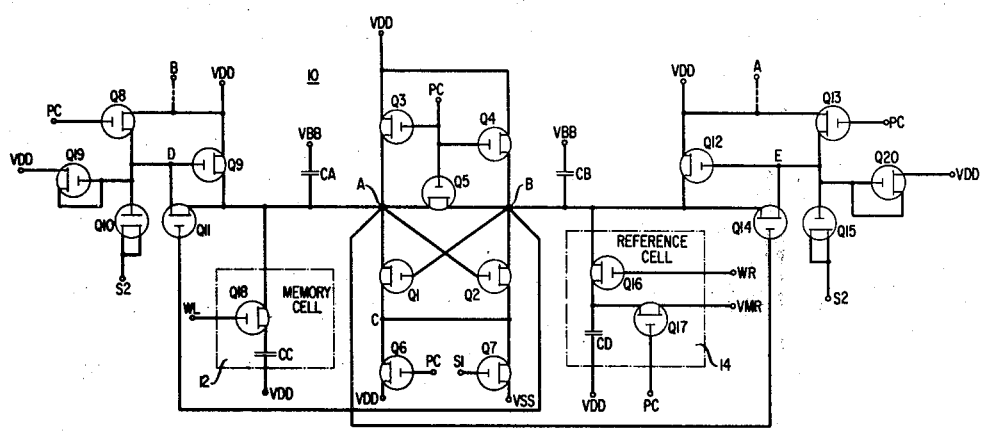

DYNAMIC SENSE-REFRESH DETECTOR AMPLIFIER

BACKGROUND OF THE INVENTION

This invention relates to detector circuits and in particular, to dynamic sense-refresh detector amplifiers useful in dynamic random access memory (RAM) systems.

U.S. Pat. No. 4,028,557, in which there is a common assignee with the present patent application, teaches a dynamic sense-refresh amplifier which is characterized by relatively low power dissipation, relatively high operating noise margin, and the capability to refresh logic information to full "1" and "0" levels. One potential problem with this sense-refresh amplifier is that during the refresh operation some of the signal used to aid in refresh is lost and it is possible under some conditions for a full "1" level not to be obtained. In addition, it is possible that the capacitive charging and discharging of the load-sense circuits will not always return these circuits to the initial potential levels. This can somewhat reduce operating noise margins.

SUMMARY OF THE INVENTION

One solution of the above-described problems is attained in an illustrative embodiment of the invention comprising a sense-refresh detector amplifier which comprises essentially first and second MOS transistors in which the respective gates are cross coupled to the drains (a cross coupled pair), voltage equalization circuitry, and two essentially identical load-refresh circuits which each comprise three MOS transistors (to be denoted as the third, fourth and fifth transistors), and a capacitor. Typically, each capacitor is an MOS transistor with the gate serving as one terminal and the drain and source together serving as the other. The drains of the cross coupled pair serve as input/output terminals. Each input/output terminal is coupled to a separate load-refresh circuit. The voltage equalization circuitry is coupled to both input/output terminals. The sources of the cross coupled pair are coupled together to the drains of the two other transistors. The first of these transistors is used to selectively set the potential of the sources of the cross coupled pair to a preselected potential. The second transistor is used to facilitate selective conduction through one and/or the other of the transistors of the cross coupled pair. The gate of the fourth transistor of each load-refresh circuit is coupled to the input/output terminal which is not otherwise coupled thereto. In addition, in a preferred embodiment a separate voltage clamping circuit means is coupled to each load-refresh circuit. Each clamping circuit means is typically an MOS transistor with the gate coupled to one of the output terminals.

The operation of the above amplifier is as follows: At the start of a cycle the voltage equalization circuitry is activated such that the two input/output terminals are essentially equalized in potential. Essentially concurrently the sources of the cross coupled pair are set in potential to a value which is essentially equal to that of the input/output terminals. The circuitry utilized to establish the initial conditions is now deactivated. Next, a "1" or "0" input signal, typically the readout of a memory cell of a dynamic random access memory (RAM), is applied to one input/output terminal and a reference signal having a potential level midway between a "1" and "0" is applied to the other input/output terminal. This causes an imbalance in the potentials of the two input/output terminals. A conduction path is then established such that one of the transistors of the cross coupled pair conducts and discharges the input/output terminal coupled thereto. The conduction through one of the transistors of the cross coupled pair further increases the differential potential between the two input/output terminals and thus effectively latches up the cross coupled pair. A voltage pulse is then applied to the capacitor of each load-refresh device. If one of the input/output terminals was initially charged to a "1" level, then the load-refresh circuit coupled thereto is turned on and that input/output terminal is charged to a "1" potential level, and not just to within one threshold voltage of the "1" level. This insures that a full "1" level is written back into the memory cell during refresh. If the input signal is a "0," then the associated load-refresh circuit does not turn on and the "0" is maintained.

The coupling of the gates of the third transistor of each load-refresh circuit to the input/output terminals insures, during activation of the load-refresh circuit, that none of the charge previously stored on the gate of a second transistor of the load-refresh circuit is discharged into the input/output terminal associated therewith. This allows the gate terminal of the second transistor to be capacitively bootstrapped in potential to allow the input/output terminal associated therewith to be charged to a full "1" level.

The voltage clamping transistors serve to clamp the voltage of the gate of the second transistors to within one threshold voltage of the power supply potential used with the circuit. This serves to help insure that the potential of the gates of the second transistors will essentially always return to a voltage level which allows a resetting to preselected level. This increases operating noise margins.

At the end of each cycle of operation of the sense-refresh detector amplifier no dc paths exist and during a cycle only transient conduction occurs. Accordingly, power dissipation is kept relatively low.

These and other features of the invention will be better understood from a consideration of the following detailed description taken in conjunction with the following drawings.

DETAILED DESCRIPTION

Figure 1:
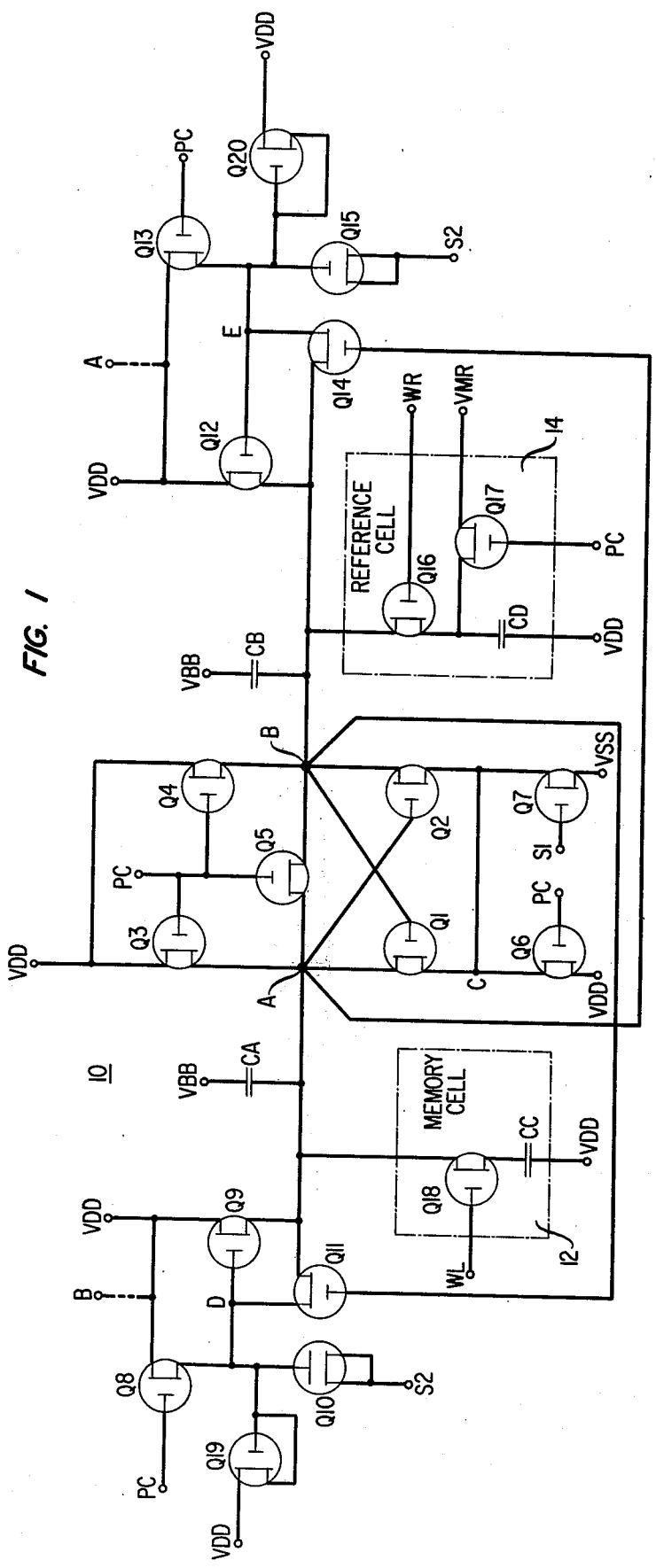
FIG. 1 illustrates a sense-refresh detector amplifier in accordance with one embodiment of the invention.

Referring now to FIG. 1, there is illustrated a dynamic sense-refresh amplifier 10 which comprises transistors Q1 through Q15, Q19 and Q20. For illustrative purposes the transistors are all assumed to be n-channel MOS transistors. An MOS transistor will be described as enabled if the potential of the gate with respect to the source is of sufficient amplitude and polarity to allow conduction between the source and drain thereof. Conversely, a disabled MOS transistor is one in which the potential of the gate is insufficient or of the wrong polarity to allow conduction between the source and drain thereof.

The drains of Q3, Q4, Q6, Q8, Q9, Q12, and Q13 are all coupled to a power supply denoted as VDD (typically +12 volts). The source of Q7 is coupled to a power supply denoted as VSS (typically 0 volts). The gates of Q3, Q4, Q5, Q6, Q8, and Q13 are all coupled to a voltage pulse source denoted as PC. The gate of Q7 is coupled to a voltage pulse source denoted as S1. The drains and sources of Q10 and Q15 are all coupled to a voltage pulse source denoted as S2. The sources of Q3, Q9, and Q11, the drains of Q1 and Q5, the gate of Q14, and the gate of Q2 are all coupled to an input/output terminal A. A parasitic capacitor CA is illustrated coupled between the A input/output terminal and power supply VBB (typically −5 volts). The drain of Q2 and the sources of Q4, Q5, Q12 and Q14, and the gates of Q1 and Q11 are all coupled to the B input/output terminal. A parasitic capacitor CB is illustrated coupled between the B input/output terminal and VBB. The sources of Q1 and Q2, the source of Q6 and the drain of Q7 are coupled to node C. The sources of Q8 and Q19, the gates of Q9, Q10, and Q19, and the drain of Q11 are all coupled to node D. Q10 is connected so as to act as a capacitor with the source and drain coupled to S2. The gates of Q12, Q15, and Q20, the sources of Q13 and Q20 and the drain of Q14 are coupled to node E. Q15 is connected so as to act as a capacitor with the source and drain coupled to S2.

A memory cell, such as the memory cell contained within dashed line rectangle 12, is typically coupled to input/output terminal A and a reference cell, such as is illustrated within dashed line rectangle 14, is typically coupled to input/output terminal B. The memory cell contained within dashed line rectangle 12 is commonly denoted as a switched capacitor memory cell. It comprises transistor Q18 and capacitor CC. The gate of Q18 is typically coupled to a word line WL of an array of memory cells of a RAM (not illustrated). One terminal of CC is coupled to the source of Q18 and the other is coupled to VDD. The drain of Q18 is coupled to input/output terminal A. The reference cell contained within dashed line rectangle 14 comprises transistors Q16 and Q17. One terminal of CD is coupled to the source of Q17. The second terminal of CD is coupled to VDD, and the gate of Q17 is coupled to PC. The drain of Q17 is coupled to a voltage pulse source VMR.

The cell shown within dashed line rectangle 12 and its mode of operation are well known. As Q18 is enabled the potential of input/output terminal A is effectively transferred to capacitor CC. A "1" stored in a memory cell results in the capacitor thereof being charged to a potential of about VDD minus one threshold voltage. A "0" stored in a memory cell results in the capacitor thereof being charged to a potential of about VSS. A "1" is written into memory cell 12 by enabling Q18 and applying a potential level of VDD to the drain of Q18 (input/output terminal A). The readout of logic information stored in memory cell 12 is accomplished by enabling Q18 and allowing the potential of the drain thereof (input/output terminal A) to change as a function of the stored logic information (the potential level of CC). The readout is destructive and accordingly the originally stored logic information must be refreshed (rewritten) or it is lost.

The reference cell contained within dashed line rectangle 14 contains essentially the same memory cell as shown with dashed line rectangle 12; however, the internal storage node between Q16 and CD is accessible through Q17 as well as Q16. Information is stored in the reference cell 14 as a function of the potential of CD. Typically CD is charged to a potential level which is midway in value between a "1" and a "0" by disabling Q16 and enabling Q17 and applying the appropriate potential to the drain of Q17 (VMR). Readout is accomplished by enabling Q16 and allowing the potential of the drain of Q16 (input/output terminal B) to change in potential as a function of the information stored in reference cell 14. The information stored in 14 is destroyed by the read operation and is restored by again enabling Q17 and applying the appropriate potential thereto. This middle value potential provides for balanced noise margin (i.e., the differential voltage established between a "1" signal applied to the A input/output terminal and the reference voltage applied to the B input/output terminal is essentially the same as that between a "0" signal applied to the A input/output terminal and the reference voltage applied to the B input/output terminal). CA and CB represent the parasitic capacitance of 10 plus that of all of the corresponding bit line of a RAM (not illustrated) and the memory cells coupled thereto. Typically CA and CB are much larger than CC and CD. Accordingly, when Q16 and Q18 are enabled, the differential change of potentials of input/output terminals A and B is typically just several hundred millivolts.

Circuit 10 operates as follows: Initially PC is held at a "1" level and WL, WR, S1 and S2 are all held at the "0" level. The VMR terminal is held at a potential level between a "1" and "0." This enables Q3, Q4, Q5, Q6, Q8, and Q13. This condition charges node D to VDD minus the threshold voltage of Q8, charges node E to VDD minus the threshold voltage of Q13, and charges node C to VDD minus the threshold voltage of Q6. Typically Q3 and Q4 have essentially the same threshold voltage since they are selected to have the same geometry and are fabricated together on a single monolithic integrated circuit chip. Any differences in the threshold voltages of Q3 and Q4 can cause input/output terminals A and B to be set to different potential levels. Q5 serves to insure that input/output terminals A and B are set to essentially the same potential by directly connecting input/output terminals A and B when Q5 is enabled. In a preferred embodiment of the invention the geometry of Q5 is selected such that the threshold voltage of Q5 is less than that of Q3 and Q4. One way to insure this is to fabricate Q5 such that its channel is shorter than the channels of Q3 and Q4. This insures that Q5 becomes enabled prior to Q3 and Q4 becoming enabled, and that even after terminals A and B reach the potentials of VDD minus the threshold voltage of Q3 and Q4, respectively, the Q5 remains enabled. Thus, even slight differences in the threshold voltages of Q3 and Q4 are effectively cancelled because Q5 insures that input/output terminals A and B are equalized in potential. Thus, when Q3, Q4, and Q5 are enabled input/output terminals A and B are set to a potential level of approximately VDD minus the threshold voltage of Q3 or Q4 (whichever is lower). Q5 thus increases the sensitivity of sense-refresh detector amplifier 10 by allowing input signals to be somewhat smaller in magnitude than would be tolerable if Q5 is not utilized. For many applications Q5 is unnecessary and may be eliminated.

Figure 2:
FIG. 2 graphically illustrates typical waveforms used with the sense-refresh detector amplifier of FIG. 1.

Typical voltage waveforms for use with the circuitry of FIG. 1 are illustrated in FIG. 2. Initially, PC is held at VDD, a "1" level, and WL, WR, S1, and S2 are all held at VSS, a "0" level. As previously indicated, VDD is typically +12 volts and VSS is typically 0 volts. PC is then pulsed in potential to VSS. This leaves input-/output terminals A and B and nodes C, D, and E floating in potential at approximately VDD minus one threshold voltage. As has been discussed earlier herein, the value of the threshold voltage is a function of the transistors coupled to the appropriate input/output terminal or circuit node. Typically a threshold voltage is 1-2 volts. With PC at VSS, the WL and WR potentials are pulsed from VSS to VDD. This enables Q16 and Q18 and thus causes input/output terminals A and B to be changed in potential in accordance with the information stored within memory cell 12 and reference cell 14, respectively.

Assuming the memory cell had stored a "1" (VDD minus one threshold voltage) and the reference cell stored a potential halfway between a "1" and a "0," input/output terminal A will remain at essentially VDD minus one threshold voltage and input/output terminal B will be discharged somewhat below VDD minus one threshold voltage. Thus, there is created a differential voltage between input/output terminals A and B.

S1 is now pulsed from VSS to VDD. This enables Q7 and thus discharges node C from VDD minus one threshold voltage towards VSS. This initially causes Q1 and Q2 to conduct and causes the potential of terminals A and B to drop to approximately VDD minus two threshold voltages. As node C discharges to VDD minus two threshold levels, Q2 is enabled, and thus input/output terminal B starts to discharge in potential toward VSS. Q1 remains at the VDD minus one threshold voltage level. At this point in time Q12 is enabled and thus there is current flow from VDD through enabled Q12, Q2 and Q7 to VSS. The relative geometry of Q12 and Q2 is selected such that the beta of Q2 is larger than that of Q12. This condition maintains Q1 disabled and thus input/output terminal A remains floating in potential at VDD minus one threshold voltage.

The cross coupling of the gates of Q11 and Q14 to terminals B and A, respectively, causes the gates of Q11 and Q14 to drop in potential at the same time input/output terminals A and B drop in potential. This maintains Q11 and Q12 disabled and insures that nodes D and E are not discharged in reaction to the initial drop in the potentials of terminals A and B. Because terminal A was initially more positive in potential than B, Q2 is more heavily turned on than Q1 and terminal B is rapidly pulled towards the VSS potential. This insures that Q11 is disabled prior to the time S2 is pulsed from VSS to VDD minus one threshold voltage. It also insures that it remains disabled during the pulsing of S2. This insures that charge stored on node D cannot discharge through Q11 and thus insures that the potential of node D is sufficiently positive such that when it is capacitively bootstrapped by the voltage pulse applied to S2 that it reaches a sufficient potential to allow the full VDD potential to be coupled through Q9 to input/output terminal A. Q14 is enabled and discharges node E towards VSS through Q2 and Q7.

After some delay (typically 10 nanoseconds) S2 is pulsed from VSS to VDD minus one threshold voltage. S2 is coupled to Q10 and Q15. Q10 and Q15 both were enabled previously and thus act as capacitors at this point in time. The potential of the gate of Q14 there is at a level of at least the potential of input/output terminal B plus one threshold voltage and Q14 is enabled. The potential of the gate of Q12 (node E) begins to discharge through enabled Q14 towards the potential of input/output terminal B. Q12 thus becomes disabled and input/output terminal B then completely discharges to VSS. Q11, which had been disabled, remains disabled and node D is bootstrapped in potential to a potential level of at least VDD plus one threshold voltage. As the potential of node D increases to a level at least one threshold voltage above VDD, input/output terminal A (the source of Q9) charges from a potential of VDD minus one threshold voltage to a potential level of VDD. The final potentials of input/output terminals A and B are therefore VDD and VSS, respectively. This indicates the readout of a "1" from memory cell 12. The potential levels of the A and/or B input/output terminals are now sensed. Q18 is already enabled at this point in time and the drain thereof is at a potential of VDD. This refreshes (rewrites) memory cell 12 by charging CC to VDD minus one threshold voltage, a "1."

It is to be noted that at this point in time there are no dc paths between VDD and VSS. Accordingly, dc power dissipation is kept relatively low. In addition, noise margin is kept high since the memory cell is refreshed to VDD minus one threshold voltage because input/output terminal A is charged to VDD even though the information readout of the memory cell onto input/output terminal A was at the VDD minus one threshold voltage level.

Now PC, WL, WR, S1, and S2 are pulsed back to the initial levels and a new cycle of the sense-refresh detector amplifier 10 can be started.

If the information stored within memory cell 12 is a "0" instead of a "1," Q1 becomes enabled and input/output terminal A is discharged towards VSS. This enables Q11 and consequently discharges the gate of Q9 and thereby disables Q9. This allows input/output terminal A to discharge to VSS. Q18 is already enabled at this point in time and the drain thereof is at a potential of VSS. This refreshes memory cell 12 in that CC is resorted to the original potential level of VSS, a "0." Input/output terminal B is charged to VDD because Q12 remains enabled and node E is charged to at least VDD plus one threshold voltage.

If memory cell 12 stores a "1" input/output terminal A is set to VDD. If a "0" is stored input/output terminal A is set to VSS. In either case the operation of 10 is such that all possible dc paths between VDD and VSS are opened at the beginning and end of a cycle. Essentially the only time a direct electrical path between VDD and VSS exists is during the time of the transient conduction through Q1 and/or Q2 and the load-refresh circuits coupled thereto.

Transistors Q19 and Q20, which are essentially connected as diodes, serve to prevent the potentials of nodes D and E from going more than one threshold voltage above VDD. Initially the potential of nodes D and E is set at VDD minus one threshold voltage. The capacitive coupling of a positive going voltage pulse applied to S2 could cause nodes D and E to go more positive in potential than VDD plus one threshold voltage if it were not for Q19 and Q20. While this would allow for the proper operation of Q9 and Q12, the potential of nodes D and E might not return to the initial value at the end of the voltage pulse applied to S2. This could mean that node D or E would not be set to VDD minus one threshold voltage since it would already be above that potential. Thus operating noise margins could be lost. The inclusion of Q19 and Q20 thus improves operating noise margins.

In another illustrative embodiment of the invention Q19 and Q20 are not utilized and the drains of Q8 and Q13 are coupled to input/output terminals B and A, respectively (as is illustrated by the dashed lines), instead of being connected to VDD. This configuration serves essentially the same purpose as the previously discussed configuration in that it causes nodes D and/or E to discharge to a value of at least VDD minus the threshold voltage at the end of the voltage pulse applied to S2.

Sixty-four of the above-described sense-refresh detector amplifiers 10 have been fabricated as part of a 4,096 bit dynamic n-channel RAM system that has been fabricated on a single silicon integrated circuit chip. Each sense-refresh amplifier was fabricated in approximately 28 square mils of semiconductor area. The VBB potential (typically-5 volts) is applied to the semiconductor substrate. The memory is divided into two 32×64 arrays of memory cells which are separated by the 64 sense-refresh amplifiers. The PC, S1, S2, WL, WR, and VMR voltage waveforms are provided by circuitry of the RAM. PC, which is generally denoted as a precharge voltage pulse, is utilized to set the potentials of circuitry of the RAM other than the sense-refresh detector amplifiers 10.

Two of the above-described amplifiers 10 have been fabricated as part of a 16,384 bit dynamic n-channel RAM system that has been fabricated on a single silicon integrated chip. These amplifiers are used as read buffers.

The power dissipation of the sense-refresh detector amplifier of high capacity MOS memories presently represents a relatively large portion of the overall power dissipation. The dynamic operation of the present sense-refresh detector amplifier facilitates relatively low power dissipation for the entire RAM.

It is to be understood that the embodiments described are merely illustrative of the general principles of the invention. Various modifications are possible within the scope of the invention. For example, p-channel MOS transistors could be substituted for the n-channel MOS transistors provided the polarities of the power supply potentials and voltage pulses are appropriately changed.

What is claimed is:

1. A sense-refresh detector comprising:
   first and second switching devices, each device having a control terminal and first and second output terminals;
   first and second input/output terminals, the first output terminal of the first device and the control terminal of the second device being coupled to the first input/output terminal and the first output terminal of the second device and the control terminal of the first device being coupled to the second input/output terminal,
   voltage equalization circuit means coupled to both input/output terminals for essentially equalizing periodically the potentials of both input/output terminals;
   first and second essentially identical load-refresh circuits, each load-refresh circuit comprising a capacitor circuit means having first and second terminals and third, fourth, and fifth switching devices each having a control terminal and first and second output terminals;
   the control terminal of the third device of each load-refresh circuit being coupled to the first output terminal of the fourth device, the second output terminal of the fifth device, and the second terminal of the capacitor circuit means;
   the second output terminals of the third and fourth devices being coupled together and being coupled to one input/output terminal;
   voltage setting circuit means being coupled to the second output terminals of the first and second devices for periodically setting the potential of said terminals to a preselected potential;
   conductive enabling circuit means being coupled to the second output terminals of the first and second switching devices for periodically facilitating conduction through the first and/or second switching device;
   being characterized in that:
   the control terminal of the fourth device of the first load-refresh circuit is coupled to the second input/output terminal; and
   the control terminal of the fourth device of the second load-refresh circuit is coupled to the first input/output terminal.

2. The apparatus of claim 1 wherein the first output terminals of the third and fifth devices of each load-refresh circuit are coupled together.

3. The apparatus of claim 2 wherein:
   the voltage equalization circuit means comprises sixth, seventh, and eighth switching devices which each have a control terminal and first and second output terminals;
   the control terminals of the sixth, seventh, and eighth devices being coupled together and the first output terminals of the sixth and seventh devices being coupled together;
   the second output terminal of the sixth device being coupled to the first input/output terminal and to the first output terminal of the eighth device; and
   the second output terminal of the seventh device being coupled to the second input/output terminal and to the second output terminal of the eighth device.

4. The apparatus of claim 3 wherein all of the switching devices are MOS transistors.

5. The apparatus of claim 4 wherein the capacitor of each load-refresh circuit is an MOS transistor in which the gate serves as the second terminal and the source and drain are coupled together and serve as the first terminal.

6. The apparatus of claim 1 further comprising:
   first and second voltage clamping circuit means;
   the first circuit clamping means being coupled to the second terminal of the capacitor circuit means of the first load-refresh circuit; and
   the second circuit clamping means being coupled to the second terminal of the capacitor circuit means of the second load-refresh circuit.

7. The apparatus of claim 6 wherein the first and second circuit clamping means each comprise a sixth switching device having a control terminal and first and second output terminals and wherein the control terminal of each sixth device is coupled to one of the output terminals of the sixth device.

8. The apparatus of claim 6 wherein the sixth switching devices are MOS transistors.

* * * * *